US008531821B2

(12) United States Patent
Holzman et al.

(10) Patent No.: US 8,531,821 B2
(45) Date of Patent: Sep. 10, 2013

(54) SYSTEM FOR SECURING A SEMICONDUCTOR DEVICE TO A PRINTED CIRCUIT BOARD

(75) Inventors: Eli Holzman, Thousand Oaks, CA (US); Paul Brian Hafeli, Ventura, CA (US); Robert Michael Sterns, Lompoc, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/016,701

(22) Filed: Jan. 28, 2011

(65) Prior Publication Data

US 2012/0195015 A1 Aug. 2, 2012

(51) Int. Cl.
*H05K 7/10* (2006.01)
*H05K 7/12* (2006.01)

(52) U.S. Cl.
USPC ........... 361/676; 361/678; 361/772; 361/774; 361/803; 439/66

(58) Field of Classification Search
USPC .... 361/767–776, 803; 439/66; 324/754–755
See application file for complete search history.

(56) References Cited

U.S. PATENT DOCUMENTS

| | | | | |
|---|---|---|---|---|
| 5,727,954 A | * | 3/1998 | Kato et al. | 439/66 |
| 6,338,629 B1 | * | 1/2002 | Fisher et al. | 439/66 |
| 6,722,893 B2 | * | 4/2004 | Li et al. | 439/66 |
| 6,781,390 B2 | * | 8/2004 | Kazama | 324/755.05 |
| 6,846,184 B2 | * | 1/2005 | Fan et al. | 439/66 |
| 7,045,889 B2 | * | 5/2006 | Canella | 257/698 |
| 7,427,809 B2 | * | 9/2008 | Salmon | 257/773 |
| 2005/0088193 A1 | * | 4/2005 | Haga | 324/754 |
| 2006/0166522 A1 | * | 7/2006 | Brodsky et al. | 439/66 |

OTHER PUBLICATIONS

Brown et al.; "Two Fundamental Approaches to Enabling High Performance LGA Connections"; HCD, Inc.; pp. 508-514, 2002.
Cole et al.; "The New Millennium for CCGA—Beyond 2000 I/O"; Journal of SMT; Vole 15, Issue 1; pp. 9, 2002.
Russell T. Winslow; "Converting Ball Grid Array Components to Column Grid Array"; MASH 2005 Workshop; http://www.sixsigmaservices.com; pp. 12, 2005.
IPC; "Joint Industry Standard—Requirements for Soldered Electrical and Electronic Assemblies"; IPC J-STD-001D; pp. 3, Feb. 2005.
Six Sigma; AS9100 & ISO 9001; Micorelectronics Component Specialist; http://www.sixsigmaservices.com/columnattach.asp; pp. 2, 2008.

* cited by examiner

*Primary Examiner* — Tuan T Dinh
(74) *Attorney, Agent, or Firm* — Cantor Colburn LLP

(57) ABSTRACT

In accordance with the teaching of the present invention, a system and method for securing a ball grid array to a printed wire board is provided. In a particular embodiment, a ball grid array comprises one or more balls configured to attach to a spring comprising one or more turns. In addition, there is a spacer plate configured to align and separate the springs, a soldering aid configured to align solder on the printed wire board and a printed wire board configured with conductive pads to attach to the ball grid array via the springs.

8 Claims, 4 Drawing Sheets

SYSTEM FOR SECURING A SEMICONDUCTOR DEVICE TO A PRINTED CIRCUIT BOARD

TECHNICAL FIELD

The present disclosure relates to semiconductor device packages, and in particular, systems and methods for securing the package to a printed wire board.

BACKGROUND

Today's complex products often contain multiple devices such as processors and microcontrollers to drive the products. As the number of devices increased and the size of the product decreased, printed wire boards were used to improve device density. Printed wire boards (PWB) (alternatively referred to as printed circuit boards (PCB)) host a number of semiconductor devices connected via circuits or wires in the board. The devices are connected to the board in a variety of methods. One method is soldering a ball grid array (BGA) package to conductive pads on the board.

However, this current method has its disadvantages. For example, the PWB may not be planar. The BGA's are manufactured to tight tolerances so that a solid connection to the board is ensured. In addition, for high pin count devices, the pitch, or distance, between the pins will be on the order of millimeters. Therefore, if the PWB is not planar, the BGA attachment may not have a complete connection to the board. Initially, the weak connection may cause intermittent communication failure with the other devices on the PWB. Over time this connection may become completely disconnected rendering the device unusable.

Another example is the effect of warpage. Most of today's PWBs are built in multiple layers comprised of a variety of materials. These materials have different coefficients of thermal expansion. When exposed to the specified temperatures of the system (e.g., −40 degrees Celsius to 140 degrees Celsius), the different layers of the board expand and contract at different rates, thus causing warpage of the board. Over time, the board will become non-planar and the rigid connection of the BGA and solder to the PWB will be unable to accommodate the warpage of the PWB resulting in disconnects between the BGA and the PWB.

In the above situations, a field engineer may remove the board and try to replace the part that is disconnected. There is risk in damaging the board when removing the BGA. There is also risk in reducing the life of the device or permanently disabling the device when reattaching the BGA balls and reattaching the BGA to the board. Also, there are many applications where replacement of parts is not possible thus creating a need to have a more robust connection of a BGA to a board.

SUMMARY

In accordance with particular embodiments of the present invention, a system and method for securing a semiconductor device to a printed wire board with flexible springs is provided. In a particular embodiment, a semiconductor device package comprise a ball grid array (BGA). The BGA is coupled to a plurality of flexible springs comprising one or more turns and configured to couple to the BGA. A spacer plate configured to align and separate the springs is attached to the BGA and spring assembly. A soldering aid configured to align to the solder on the printed wire board (PWB) is attached to the PWB. The BGA, spring and spacer plate assembly is coupled to the conductive pads on the printed wire board (PWB).

Technical advantages of one or more embodiments of the present invention may include improved flexibility in the x, y and z axes of the connection between the BGA and the PWB. The improved flexibility in all directions provides several advantages. First, the flexible connection provided by the springs may minimize breakage and shorting of the multiple connections of the BGA to the PWB. Second, if the PWB becomes non-planar due to warpage or contraction and expansion due to temperature extremes, the springs can adjust without compromising the connection between the BGA, springs and PWB.

These advantages may reduce breakage and shorting of the connection between the package and the board, thus reducing the need to repair in the field. In addition, to decreasing the need for repair, this method and system may improve the reliability of the product. In applications, such as military and space, where there is minimal possibility of repair, this is an important advantage.

Other technical advantages will be readily apparent to one skilled in the art from the following figures, descriptions, and claims. Moreover, while specific advantages have been enumerated above, various embodiments may include all, some or none of the enumerated advantages.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION

Figure 1A:
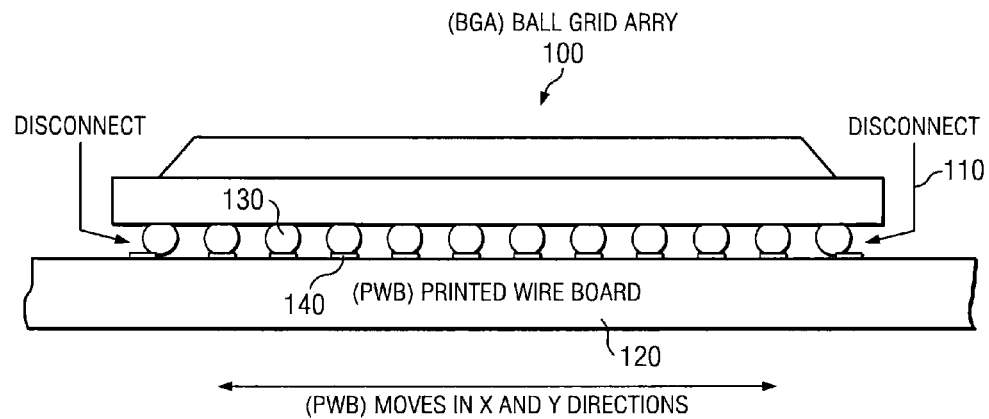
FIG. 1A is a diagram illustrating a prior art example of disconnects between a ball grid array (BGA) directly attached to a printed wire board (PWB) due to movement in the x or y axes.

FIG. 1A is a diagram illustrating an example of a ball grid array (BGA) directly attached to conductive pads on a board such as a printed wire board (PWB). The BGA 100 comprises a semiconductor device in communication with other semiconductor devices on PWB 120. The BGA communicates to other devices via the balls 130 attached to the conductive pads 140 on the PWB 120. There may be disconnects 110 if there is movement in the x or y direction. If the BGA 100 is not securely attached to the conductive pads on the board, operation of the device may be intermittent or completely disrupted. These disconnects 110 cause product failure in the field. In some applications such as military or space, repair or re-work of the board is not possible. In the case where repair is possible, there is a risk of damaging the conductive pads 140 on the printed wire board (PWB) 120 during device removal. There is also a risk of damaging or reducing the life of the device during removal from the board, re-attachment of the BGA balls 130 and re-attachment to the PWB 120.

Figure 1B:
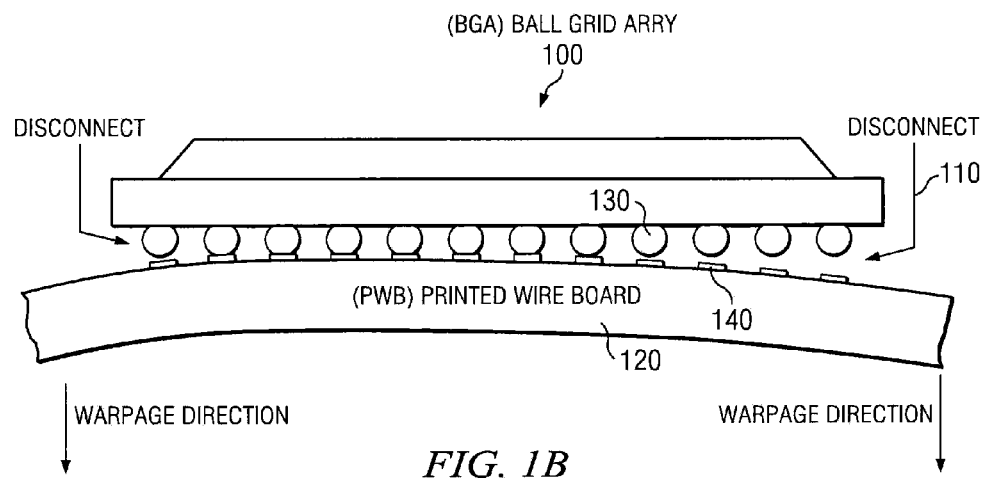
FIG. 1B is a diagram illustrating a prior art example of disconnects between a BGA directly attached to a PWB due to warpage in the z axis.

FIG. 1B is a diagram illustrating an example of a ball grid array (BGA) 100 directly attached to the conductive pads 140 on the printed wire board 120. There may be disconnects 110 if there is movement in the z direction due to device warpage or contraction and expansion due to temperature extremes. If the BGA 100 is detached from the conductive pads 140 on the board, operation of the device may be completely disrupted. These disconnects 110 cause product failure in the field. In some applications such as military or space, repair or re-work of the board is not possible. In the case where repair is possible, there is a risk of damaging the conductive pads 140 on the printed wire board during (PWB) 120 device removal. There is also a risk of damaging or reducing the life of the device during removal from the board, re-attachment of the BGA balls 130 and re-attachment to the PWB.

Figure 2A:
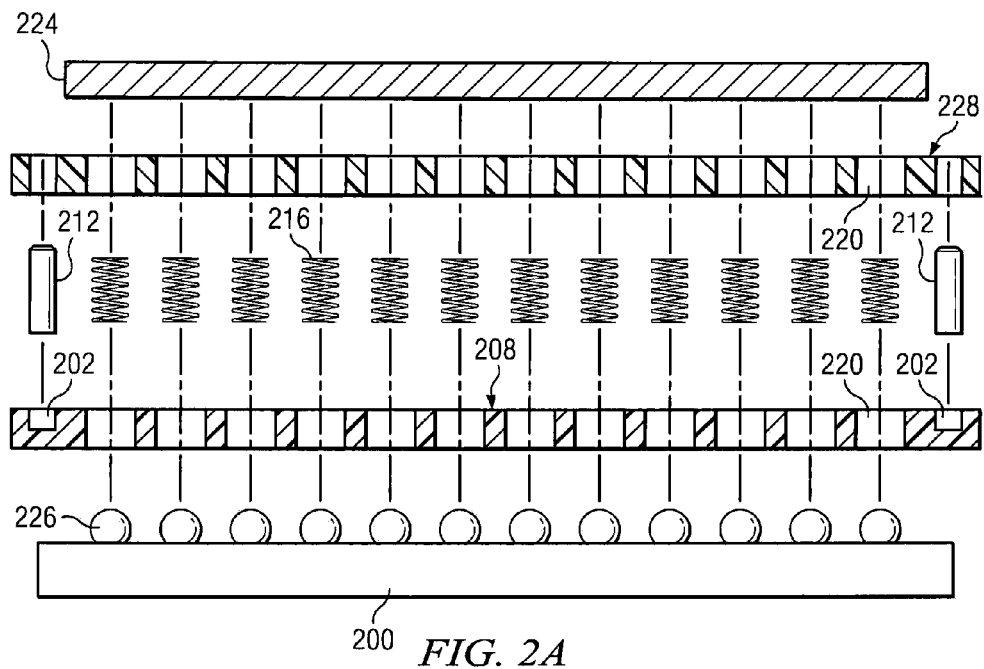
FIG. 2A is a diagram illustrating the assembly process for attaching the springs to a BGA, according to one embodiment of the present invention.

FIG. 2A is a diagram illustrating the assembly process for attaching the springs to a BGA, according to one embodiment of the present invention. BGA 200 may comprise ceramic, plastic or any other material to provide protection to the circuitry inside the BGA or withstand the temperatures required for assembly or the final product. BGA 200 includes a number of balls 226 used to electrically couple BGA 200 to a circuit board, such as a printed wire board (PWB). The balls of BGA 200 may comprise metal alloys, such as tine and lead, suitable for melting and attaching to the conductive pads of a PWB in certain temperatures. To begin the assembly process, BGA 200 is turned upside down, then a first spacer plate 208 is aligned with the balls 226 on BGA 200. First spacer plate 208 comprises any material, such as Durastone or polyamide, suitable to withstand the temperatures required during the reflow or assembly process. First spacer plate 208 comprises holes 220 that have a diameter big enough to allow a set of springs 216 to slide through and make contact with the balls on BGA 200. The springs 216 are comprised of a flexible wire, such as phosphorous bronze, and plated with a suitable material, such as silver, that facilitates attachment via soldering. In some embodiments, a silver plated phosphorous bronze spring may be used. Such a material may be used to address embrittlement issues. For example, using a gold plated spring may comprise the quality of the connection due to embrittlement. The gold may turn to dust within the solder and create voids in the connection. A silver plated phosphorous bronze spring does not have these issues. Such a material may be used in certain embodiments to meet standards such as the Joint Industry Standard IPC J-STD-001D which list specific requirements to avoid embrittlement issues. These standards are often required for certain applications such as military or aerospace. An alignment pin 212 may be used that fits inside holes 202 of first spacer plate 208. Alignment pin 212 comprises any material such as aluminum or steel suitable to withstand the temperature requirements of the assembly or reflow process. After springs 216 and pins 212 are in place a second spacer plate 228 similar to first spacer plate 208 is placed on top of first spacer plate 208 such that springs 216 are placed through holes 220 of spacer plate 208 and 228. In some embodiments, the combined height of the two spacer plate 208 and 220 is less than the height of the spring 216. Aluminum plate 224 is placed on top of springs 216 to ensure planarity of the final assembly. Additional details of the assembly process will be described in FIG. 4.

Figure 2B:
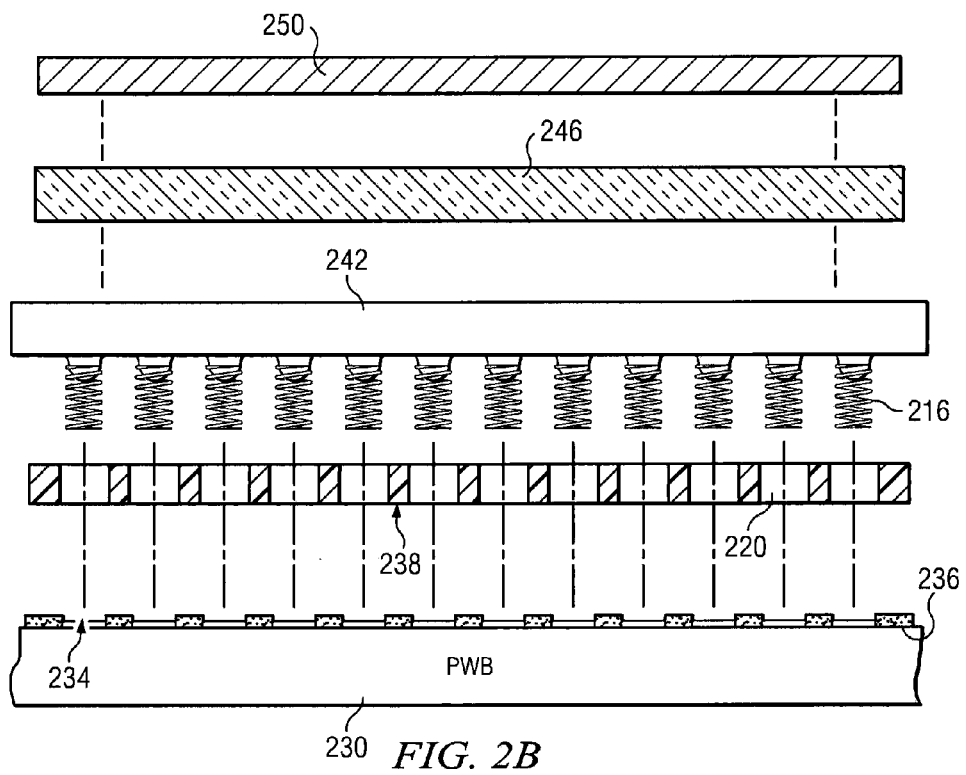
FIG. 2B is a diagram illustrating the assembly process for attaching the BGA and spring assembly of FIG. 2A to a PWB, according to one embodiment of the present invention.

FIG. 2B is a diagram illustrating the assembly process for attaching the BGA and spring assembly of FIG. 2A to a printed wire board (PWB), according to one embodiment of the present invention. PWB 230 has conductive pads 234 configured to align with the springs of assembly 242, which comprises the BGA 200, balls 226 and springs 216 as assembled in FIG. 2A. PWB 230 is a multi-layer board comprised of circuitry to connect multiple devices attached to the PWB via solder techniques. Pads 234 comprise material, such as solder, that will adhere to the springs when the board is placed through the assembly or reflow process. Assembly 242 created in the example of FIG. 2A will have the spacer plates 208 and 228 removed during the cleaning step of the assembly process. This will be further described in FIG. 4. The springs 216 of assembly 242 are then placed through holes 220 of a clean spacer plate 238. The springs 216 of assembly 242 are placed on the conductive pads 234 of the PWB 230. A soldering aid 236 may be used to ensure alignment between the PWB 230 and the BGA spring assembly 242. A heat protector 246 is then placed on assembly 242 to shield assembly 242 from the reflow heat required during the attachment of the spring to pads 234. An aluminum plate 250 provides weight to ensure a planar connection during reflow as described in further details in FIG. 4.

Figure 3:
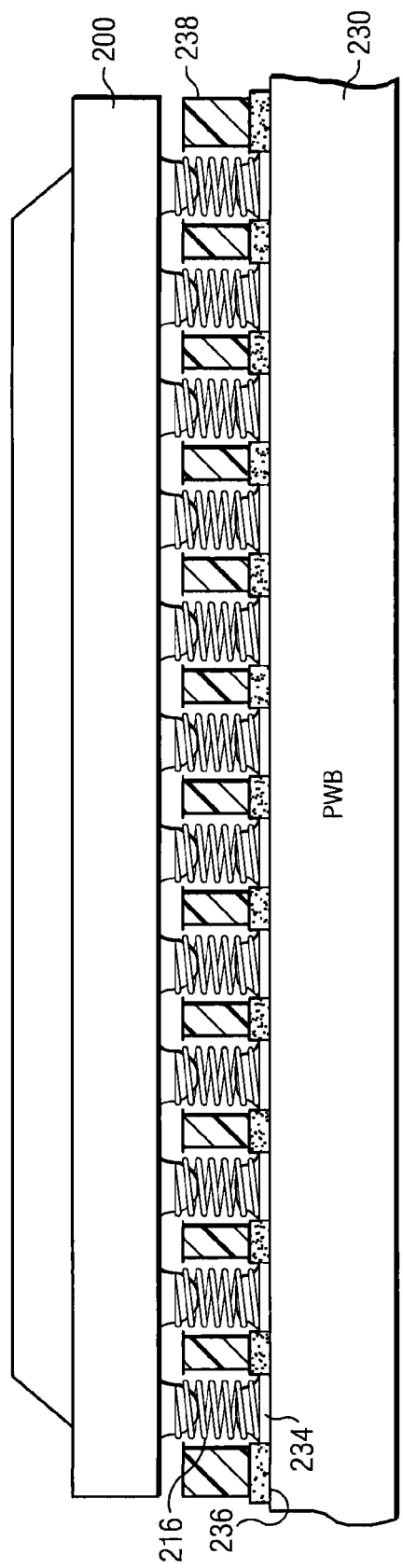
FIG. 3 is a diagram illustrating a completed attachment where the BGA and PWB are connected using springs, according to one embodiment of the present invention.

FIG. 3 is a diagram illustrating a completed attachment where the BGA and PWB are connected using springs, according to one embodiment of the present invention. BGA 200 is attached to springs 216. Springs 216 are attached to conductive pads 234 on PWB 230. Soldering aid 236 remains on the board as does spacer plate 238. These springs 216 facilitate flexibility in the x, y and z direction. This flexibility may minimize reliability issues that force the need for repair and rework. In addition, this may reduce reliability issues that cause product fails in high stress applications such as military or space.

Figure 4:
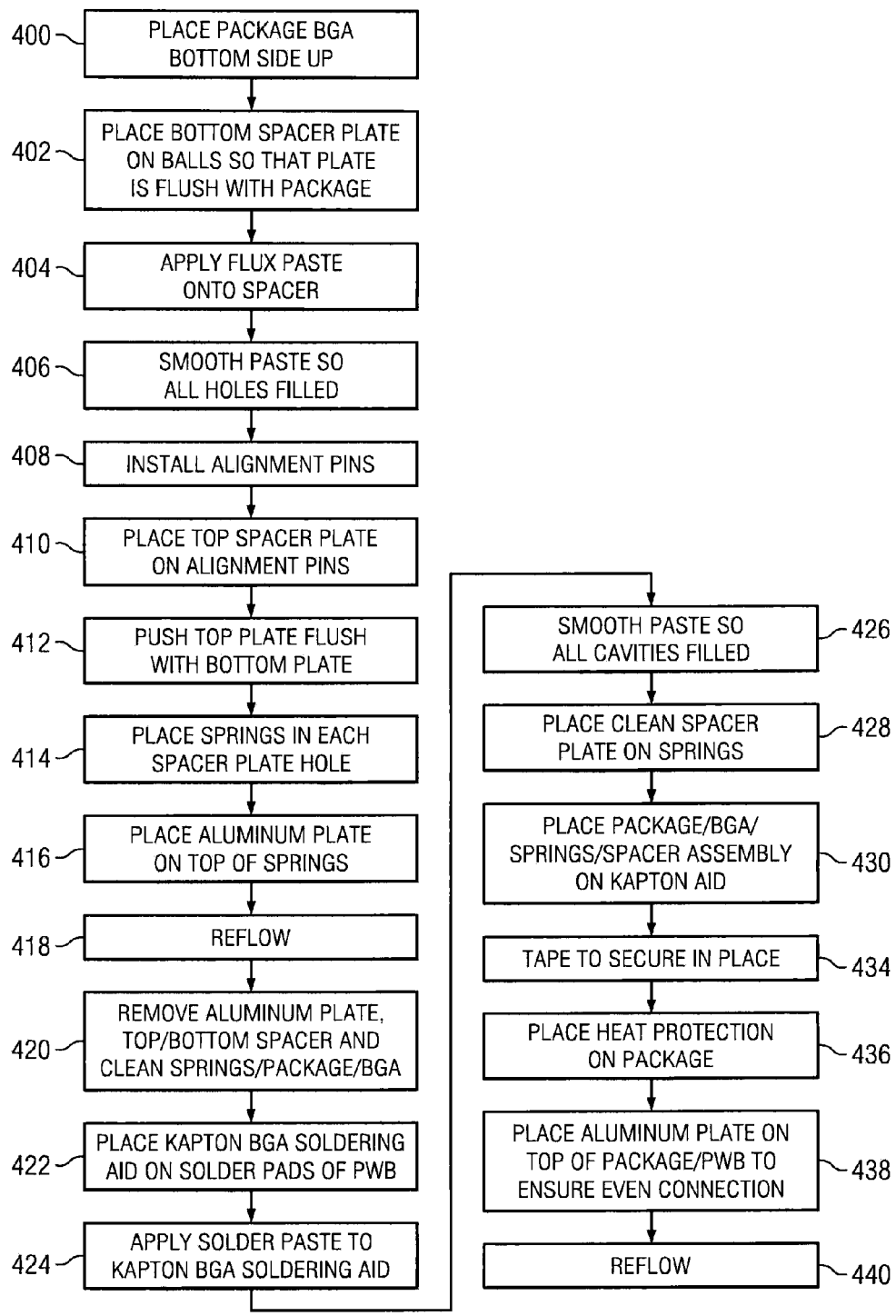
FIG. 4 is a flow chart illustrating an assembly process according to one embodiment of the present invention.

FIG. 4 is a flow chart illustrating an assembly process for attaching the BGA to the PWB as shown in FIGS. 2A, 2B and 3 according to one embodiment of the present invention. In step 400, the BGA is placed bottom side up so that the balls are exposed. In step 402, the first (or bottom) spacer plate is placed on the balls so that the plate is flush with the package. In step 404, flux paste is applied to the spacer plate. In step 406, the flux paste is squeegeed so that all of the holes in the spacer plate are filled with flux paste. In step 408, the alignment pins are placed in the outer holes of the spacer place. In step 410, the second (or top) spacer plate is placed on the alignment pins. The second (top) spacer plate is then pushed flush with the bottom plate in step 412. In step 414, the springs are placed in each spacer plate hole. The flux paste applied in step 404 will hold the springs in place against the balls of the BGA. The height of the springs may be greater than the height of the two spacer plates put together flush. In step 416, an aluminum plate is placed on top of the springs. The aluminum plate ensures good contact between the springs and the BGA balls. It will further ensure the contact area between the springs and the conductive pads on the PWB is planar. In step 418, the assembly described above is reflowed. During reflow the assembled items may be placed in an infrared convection or "pizza oven." As an example, the assembled items may slowly travel through several heat zones that allow the solder to heat slowly and cool slowly. As just an example, an industry standard goal is 4 degrees Celsius per second to avoid thermal shock although this may be different in other embodiments. During the reflow process, the BGA solder ball melts onto the spring with the aid of the flux paste. The solder will only travel partially up the spring leaving one or more turns of the springs uncovered to maintain the spring flexibility. In some embodiments, two turns are left uncovered, however, more or less turns of the spring may be left uncovered by solder from the BGA ball. In step 420, the aluminum plate, first (top) spacer plate and second (bottom) spacer plate are removed to allow for cleaning and removal of the flux paste and other possible byproducts of the assembly process. In step 422, a BGA soldering aid may be placed on the solder pad area of the PWB. For example, a Kapton BGA soldering aid may be used that is laser cut in a pattern that matches the pattern of the pads on the PWB. The cutouts expose the pads for soldering. The thickness of the Kapton aid may vary, but it will generally be thick enough to create a cavity on top of the PWB exposed pads. In step 424, the soldering paste is applied to the BGA soldering aid. In step 426, the paste is smoothed so that all the cavities are filled. In step 428, a clean spacer plate is placed on the springs. This spacer plate is not attached to the PWB or the BGA. Its purpose is to ensure that the springs do not short together during extreme vibration, such as the launch of a satellite. The combined spacer plate and BGA spring assembly is placed onto the soldering aid in step 430. In step 434, tape, of any material suitable to withstand the heat of the reflow or assembly process is placed on the BGA assembly to secure it into place on the PWB. Heat protection is placed on top of the package in step 436 to ensure that the heat from the next reflow process does not affect the already connected springs and BGA. In step 438, the aluminum plate used in step 416 is placed on top of the heat protection from step 436. As in step 416, the aluminum plate is placed on top of the combined item and the items are placed again through reflow (step 440). The reflow in step 440 is similar to the reflow step 418, however, in this case, the springs are attached to the pads on the PWB. After reflow the connection between the springs and the PWB is complete (Step 442) and the aluminum plate and the heat protection can be removed from the assembly.

Although FIG. 4 discloses a particular number of steps to be taken with respect to the method of securing a semiconductor device to a printed wire board, the steps may be executed with more or fewer steps than those depicted in FIG. 2 through FIG. 4. In addition, although FIG. 4 discloses a certain order of steps to be taken with respect to the method of securing a semiconductor device to a printed wire board, the steps comprising the method of securing a semiconductor device to a printed wire board may be completed in any suitable order.

Although the present invention has been described in a preferred embodiments, various changes and modifications may be suggested to one skilled in the art. As examples only, embodiments may have a different number of pins, the configuration of the array may differ, the pitch of the array may differ, the size of the balls may differ, the size of the springs may differ and the material may differ. It is intended that the present invention encompass such changes and modifications as fall within the scope of the appended claims.

What is claimed is:

1. A system for securing a ball grid array (BGA) to a printed board (PWB), the system comprising:
   a ball grid array comprising one or more balls;
   a plurality of springs each comprising one or more turns and configured to attach to a ball in the ball grid array;
   a spacer plate comprising a plurality of holes configured to align and separate the springs;
   a printed wire board comprising conductive pads; and
   a soldering aid disposed on the printed wiring board adjacent the conductive pads, the soldering aid configured to align solder on the printed wire board, wherein the spacer plate is flush with the soldering aid, and sidewalls of the soldering aid abut sidewalls of the conductive pads; and
   wherein the springs are soldered to the balls of the ball grid array with the conductive pads of the printed wire board (PWB) such that the balls are reflowed inwardly with respect an interior of the springs so as to cover two or more turns of the springs.

2. The system according to claim 1, wherein each spring comprises a flexible wire.

3. The system according to claim 1, wherein the soldering aid comprises Kapton or polyamide tape.

4. The system according to claim 1, wherein the soldering aid comprises one or more holes configured to align with pads on the printed wire board; and
   the holes are configured to provide a cavity for holding a liquid.

5. The system according to claim 1, wherein the spacer plate comprises polyamide or Durastone.

6. The system according to claim 1, wherein the spacer plate comprises alignment pin holes and the system further comprises:
   a second spacer plate comprising a plurality of holes configured to align and separate the springs and alignment pin holes; and
   alignment pins positioned between the spacer plates in the alignment pin holes of the spacer plates.

7. The system according to claim 1, wherein the printed wire board comprises one or more layers; and
   the top layer comprises the conductive pads configured to electrically connect the printed wire board to the ball grid array via the springs.

8. The system according to claim 2, wherein the spring comprises a flexible phosphorous bronze wire placed with silver.

* * * * *